United States Patent [19]
Naiki

[11] Patent Number: 6,134,255
[45] Date of Patent: Oct. 17, 2000

[54] LAMINATE TYPE MULTI-SEMICONDUCTOR LASER DEVICE AND LASER BEAM SCANNING OPTICAL APPARATUS EMPLOYING THE SEMICONDUCTOR LASER DEVICE

[75] Inventor: Toshio Naiki, Toyokawa, Japan

[73] Assignee: Minolta Co., Ltd., Osaka, Japan

[21] Appl. No.: 08/932,493

[22] Filed: Sep. 18, 1997

[30] Foreign Application Priority Data

Sep. 24, 1996 [JP] Japan ..................................... 8-251745
Aug. 22, 1997 [JP] Japan ..................................... 9-225957

[51] Int. Cl.$^7$ .................................................. H01S 3/085
[52] U.S. Cl. ............................................... 372/50; 372/36
[58] Field of Search ................................. 372/50, 23, 36

[56] References Cited

U.S. PATENT DOCUMENTS

| | | | |
|---|---|---|---|
| 4,251,126 | 2/1981 | Minoura et al. | 359/206 |
| 5,115,285 | 5/1992 | Menigaux et al. | 372/50 |
| 5,386,428 | 1/1995 | Thornton et al. | 372/50 |
| 5,394,426 | 2/1995 | Joslin | 372/36 |
| 5,742,631 | 4/1998 | Paoli | 372/50 |

FOREIGN PATENT DOCUMENTS

| | | |
|---|---|---|
| 54-085744 | 7/1979 | Japan . |
| 59-012667 | 1/1984 | Japan . |
| 61-048811 | 3/1986 | Japan . |
| 1-086109 | 3/1989 | Japan . |
| 6-018796 | 1/1994 | Japan . |
| 6-244496 | 9/1994 | Japan . |

*Primary Examiner*—James W. Davie
*Attorney, Agent, or Firm*—Sidley & Austin

[57] ABSTRACT

Provided is a laminate type multi-semiconductor laser device and a laser beam scanning optical apparatus employing the semiconductor laser device to be assembled into a laser printer or a digital copying machine for executing image printing at a high speed by means of a plurality of laser beams. The laminate type multi-semiconductor laser device is provided with a laminate wafer in which a plurality of active layers are laminated and light emitting regions which are provided in the active layers as mutually displaced in a direction perpendicular to the laminate direction in which the active layers are laminated. Assuming that an interval between the light emitting regions of adjacent active layers in the direction perpendicular to the laminate direction is p and an interval between the adjacent active layers is q, then a relational expression of q>p is satisfied.

5 Claims, 6 Drawing Sheets

LAMINATE TYPE MULTI-SEMICONDUCTOR LASER DEVICE AND LASER BEAM SCANNING OPTICAL APPARATUS EMPLOYING THE SEMICONDUCTOR LASER DEVICE

BACKGROUND OF THE INVENTION

1. Field of the Invention

The present invention relates to a laminate type multi-semiconductor laser device and a laser beam scanning optical apparatus employing this semiconductor laser device, and in particular, to a laminate type multi-semiconductor laser device and a laser beam scanning optical apparatus employing this semiconductor laser device to be assembled into a laser printer or a digital copying machine for executing image printing at a high speed by means of a plurality of laser beams.

2. Description of Related Arts

As a laminate type multi-semiconductor laser device, there has been conventionally known one as disclosed in Japanese Patent Laid-Open Publication No. 6-244496. In this laminate type multi-semiconductor laser device, a plurality of light emitting regions are provided at specified pitches in an identical active layer.

In general, a laminate type multi-semiconductor laser device cannot wholly convert a laser drive power into an optical energy no matter whether a plurality of light emitting regions are provided in an identical active layer. The laser drive power that has not been converted into the optical energy is converted into a thermal energy as a thermal loss, thereby heating the light emitting regions. On the other hand, if a relationship between the laser drive power and a laser beam output is expressed by a function, the temperature of the light emitting regions is included as a parameter.

Therefore, when the light emitting regions are located close to one another in the laminate type multi-semiconductor laser device, due to thermal crosstalk between adjacent light emitting regions, the heat of one light emitting region is transmitted to the other light emitting region, thereby causing a problem that the absolute light quantity of the laser beam emitted from each light emitting region varies or a problem that a relative light quantity difference is generated between the laser beams emitted from the light emitting regions. Particularly, if a relative light quantity difference is generated between the laser beams emitted from the light emitting regions, the resulting image quality is significantly deteriorated to a disadvantage. Furthermore, due to the heating of each light emitting region, the wavelength of the laser beam emitted from each light emitting region changes, thereby causing a problem that a chromatic aberration is increased on a scanning surface. Furthermore, it has been required to secure a fairly large space for the provision of signal lines of the light emitting regions.

For the above reasons, in the prior art laminate type multi-semiconductor laser device it has been hard to locate the light emitting regions close to one another, and it has been perceived that the interval between light emitting regions is required to be at least about 100 $\mu$m. Therefore, when the prior art multi-semiconductor laser device in which a plurality of light emitting regions are provided in an identical active layer is mounted on a laser beam scanning optical apparatus with the light emitting regions arranged in a sub-scanning direction and parallel writing is executed by this laser beam scanning optical apparatus, there results in simultaneous exposure of a plurality of lines located apart by a beam interval of several lines in the sub-scanning direction on the scanning surface. More specifically, when the interval between the light emitting regions is about 100 $\mu$m, there results simultaneous exposure of a plurality of lines located apart by a beam interval of about 3 mm on the scanning surface.

When the beam interval is large in the sub-scanning direction on the scanning surface as described above, a main scanning line curves in a main scanning direction on the scanning surface to generate a bow of a considerable curve, and this significantly varies the beam interval in the sub-scanning direction for every field angle in the main scanning direction. Furthermore, if the beam interval on the scanning surface is large and when beam scanning is executed on a photosensitive drum as in a printer, the interval between projection positions of the beams significantly varies due to unevenness in rotating velocity and eccentricity of the photosensitive drum. The above results tell the fact that the laser beam scanning optical apparatus employing the prior art laminate type multi-semiconductor laser device has had the tendency of causing deterioration in the image quality.

Figure 8:
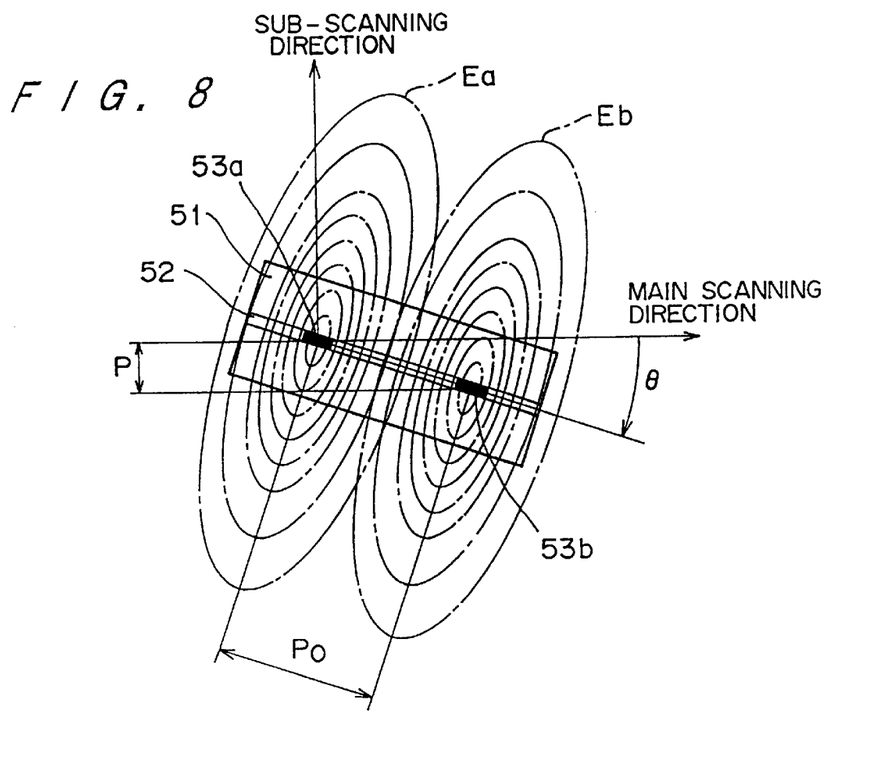
FIG. 8 is a diagram of a prior art laminate type multi-semiconductor laser device and intensity distributions of laser beams emitted from this semiconductor laser device.

Accordingly, as a countermeasure to the above disadvantages, as shown in FIG. 8, there has been proposed a method of narrowing the interval between light emitting regions 53$a$ and 53$b$ taking advantage of the fact that a pitch P in the sub-scanning direction is apparently reduced to P=P$_O$sin$\theta$ by inclining, at an angle $\theta$, the multi-semiconductor laser device 51 in which the plurality of light emitting regions 53$a$ and 53$b$ are provided as located apart by P$_O$ in an identical active layer 52. In this case, the multi-semiconductor laser device 51 is to be mounted on a laser beam scanning optical apparatus of a multi-beam system in such a manner that its direction parallel to the active layer 52 is directed approximately in the main scanning direction and its direction perpendicular to the active layer 52 is directed approximately in the sub-scanning direction. Then, each laser beam emitted from the semiconductor laser device 51 has an elliptic intensity distribution in which its divergence angle is wide in the direction perpendicular to the active layer 52 and is narrow in the direction parallel to the active layer 52. Therefore, the direction of the wider divergence angle is arranged approximately in the sub-scanning direction. It is to be herein noted that Ea and Eb in FIG. 8 indicate equi-level lines of the intensity distributions of the laser beams.

Figure 9:
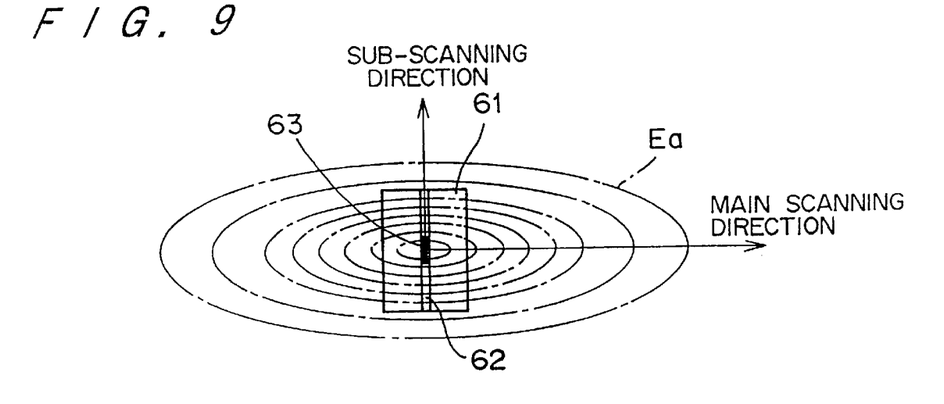
FIG. 9 is a diagram of another prior art laminate type semiconductor laser device and an intensity distribution of a laser beam emitted from this semiconductor laser device.

On the other hand, as shown in FIG. 9, in the case of a semiconductor laser device 61 in which only one light emitting region 63 is provided in an active layer 62, the semiconductor laser device 61 is generally mounted on a laser beam scanning optical apparatus of a single-beam system in such a manner that its direction perpendicular to the active layer 62 is directed in the main scanning direction and its direction parallel to the active layer 62 is directed in the sub-scanning direction. This arrangement is adopted for the reason that the focal distances of a collimator lens and a cylindrical lens can be reduced for the compacting of the device when the direction of the wider divergence angle is arranged in the main scanning direction in terms of the construction of the laser beam scanning optical apparatus of the single-beam system. The arrangement is adopted also for the reason that there is no need for placing an optical member such as a beam expander for changing the laser beam diameter on the optical path, allowing the device construction to be simplified.

For the above reasons, the laser beam scanning optical apparatus of the single-beam system employing the semiconductor laser device 61 in which only one light emitting region 63 is provided in the active layer 62 and the laser beam scanning optical apparatus of the multi-beam system employing the semiconductor laser device 51 in which the plurality of light emitting regions 53a and 53b are provided in the identical active layer 52 have been required to employ different optical system constructions. In concrete, both the systems have been required to have different focal distances of the collimator lens, cylindrical lens and scanning lens. If an optical system is commonly used, both the systems have significantly different beam diameters on the photosensitive surfaces both in the main scanning direction and the sub-scanning direction. As a result, the laser beam scanning optical apparatus of the single-beam system and the laser beam scanning optical apparatus of the multi-beam system cannot be commonly used, and this has led to the problem of manufacturing cost increase.

SUMMARY OF THE INVENTION

The object of the present invention is to provide a laminate type multi-semiconductor laser device which can be also used as a laser beam scanning optical apparatus of a single-beam system merely by replacing the laser light source and a laser beam scanning optical apparatus employing this semiconductor laser device.

In order to achieve the above object, the laminate type multi-semiconductor laser device of the present invention is provided with:

(a) a laminate wafer in which a plurality of active layers are laminated; and (b) light emitting regions which are provided in the active layers as mutually displaced in a direction perpendicular to a laminate direction in which the active layers are laminated in the laminate wafer.

In this case, the laminate wafer means a laminate in which a semiconductor substrate, an active layer, a clad layer, a gap layer, an electrode layer and so forth are laminated.

With the above arrangement, by setting the light emitting regions so that they are mutually displaced appropriately in the direction perpendicular to the laminate direction of the laminate wafer, the intervals between the light emitting regions are arbitrarily set. Therefore, the beam interval on a scanning surface is easily set to the optimum value.

Furthermore, according to the laminate type multi-semiconductor laser device of the present invention, assuming that an interval between the light emitting regions of adjacent active layers in a direction perpendicular to the laminate direction of the laminate wafer is p and an interval between the adjacent active layers is q, then a relational expression of q>p is satisfied.

With the above arrangement, the thermal crosstalk between the adjacent light emitting regions is suppressed, so that heat is hard to be transmitted from the adjacent light emitting region. Therefore, the absolute light quantity of the laser beam emitted from each light emitting region is hard to vary and a relative light quantity difference between the laser beams emitted from the light emitting regions is suppressed. Furthermore, a phenomenon that the wavelength of the laser beam shifts due to the heat transmitted from the adjacent light emitting region is suppressed, reducing the chromatic aberration on the scanning surface.

Furthermore, by using this laminate type multi-semiconductor laser device as a laser source of a laser beam scanning apparatus and arranging its active layer in parallel with the sub-scanning direction, the direction of the wider divergence angle of the laser beams is put in parallel with the main scanning direction. Therefore, the laser beam scanning optical apparatus of the multi-beam system can be used as a laser beam scanning optical apparatus of the single-beam system merely by replacing the laser source (including a driver for driving the semiconductor laser device).

BRIEF DESCRIPTION OF THE DRAWINGS

These and other objects and features of the present invention will be apparent from the following description with reference to the accompanying drawings, in which.

DETAILED DESCRIPTION OF THE PREFERRED EMBODIMENTS

A laminate type multi-semiconductor laser device and a laser beam scanning optical apparatus employing the semiconductor laser device according to an embodiment of the present invention will be described below with reference to the accompanying drawings.

Description of Laminate Type Multi-Semiconductor Laser Device

Figure 1:
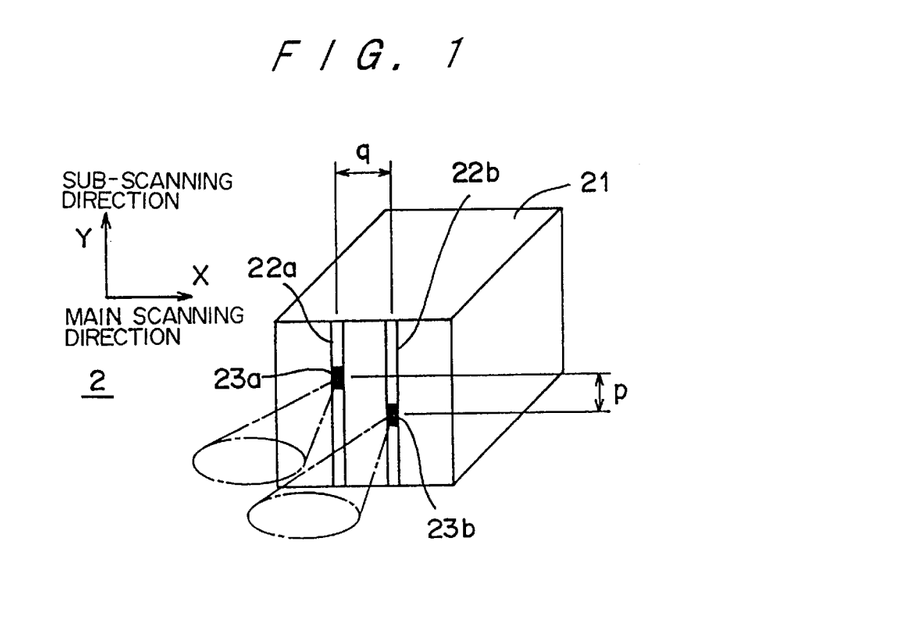
FIG. 1 is a perspective view showing a laminate type multi-semiconductor laser device according to an embodiment of the present invention.

As shown in FIG. 1, a laminate type multi-semiconductor laser device 2 has a laminate wafer 21 constructed of a semiconductor substrate, a clad layer, a gap layer, active layers 22a and 22b and so forth. This laminate wafer 21 is constituted by repeatedly executing the processes of photo-resist coating, vapor deposition, etching and so forth by the known techniques of photolithographic method, vapor deposition methods and so forth, to laminate the clad layer, gap layer and active layers 22a and 22b and so forth on the semiconductor substrate.

The active layers 22a and 22b of the laminate wafer 21 have respective light emitting regions 23a and 23b which are provided as mutually displaced by a distance p in a direction (a Y-direction in FIG. 1) perpendicular to the laminate direction in which the active layers 22a and 22b are laminated in the laminate wafer 21 (in an X-direction in FIG. 1). This distance p can be arbitrarily set, and therefore, the beam interval on a scanning surface can be set to a value optimum for any of various printing densities. For the purpose of reducing the beam interval on the scanning surface, it is preferable to set the dimension of the distance p to a value smaller than 100 µm.

On the other hand, for the purposes of suppressing the influence of the thermal crosstalk between the light emitting regions 23a and 23b and securing a space for providing signal lines for the light emitting regions 23a and 23b, it is required to set the interval between the light emitting regions 23a and 23b to a value not smaller than 100 µm. Therefore, an interval q between the active layers 22a and 22b is set to a value not smaller than 100 µm. With this arrangement, the thermal crosstalk between the light emitting regions 23a and 23b is suppressed, which suppresses a change in the absolute light quantity of each of the laser beams emitted from the light emitting region 23a and 23b, a relative light quantity difference and the phenomenon that the wavelength shifts. Thus, the laminate type multi-semiconductor laser device 2 satisfies the relational expression of q>p, and the light emitting regions 23a and 23b are located at a greater interval in the main scanning direction than in the sub-scanning direction.

Furthermore, in order to make the laser beam scanning optical apparatus of the multi-beam system usable as a laser beam scanning optical apparatus of the single-beam system merely by replacing the laser source, it is preferable to set the distance p and the interval q so that they satisfy the following conditional expressions (1) and (2).

$$(p^2+q^2)^{1/2} \leq 100 \text{ µm} \quad (1)$$

$$p \leq 20 \text{ µm, more preferably, } p \leq 15 \text{ µm} \quad (2)$$

where q>p

The conditional expression (1) is for the purposes of suppressing the influence of the thermal crosstalk between the light emitting regions 23a and 23b and securing a space for providing signal lines for the light emitting regions 23a and 23b.

On the other hand, the conditional expression (2) is required for the reasons described as follows. Generally, in a laser beam scanning optical apparatus of the multi-beam system, serial scanning or interlaced scanning is executed when the laser beam spot diameter on the scanning surface is not greater than 63.5 µm (corresponding to an image density of 400 dpi). It is to be herein noted that the serial scanning is to execute scanning of serial lines (the first, second, ... lines) by means of a plurality of laser beams. The interlaced scanning is to execute scanning of scanning lines apart from each other with some scanning lines in-between by means of a plurality of laser beams. Then, for the purposes of suppressing occurrences of a bow by improving the ability of correcting errors of perpendicularity of reflective facets of a scanner, reducing the sub-scanning magnification $\beta_S$ and securing appropriate brightness, shape and so forth of the laser beam spots on the scanning surface, it is required to set the main scanning magnification $\beta_M$ of the laser beam scanning optical apparatus to 15 through 30 and set the sub-scanning magnification $\beta_S$ to 6 through 20. For these purposes, it is required to set the distance p to a value not greater than 20 µm (preferably not greater than 15 µm).

If the distance p is made greater than 20 µm, there results interlaced scanning of a plurality of lines located apart with several lines in the sub-scanning direction therebetween. Therefore, a number of memory regions must be provided for storing image data of the scanning lines to be subsequently scanned between memory regions for storing therein image data of the scanning lines to be previously scanned, consequently increasing the memory cost. When the beam interval in the sub-scanning direction is large on the scanning surface, the bow curve on the scanning surface is significantly large, causing the beam interval in the sub-scanning direction to vary for every field angle in the main scanning direction.

Furthermore, in this case, the interval between the optical paths of the laser beams emitted from the light emitting regions is wide, and therefore, it is required to use a collimator lens 3 and a cylindrical lens 4 having a large lens diameter. Therefore, a quantity of variation in lens dimensions in accordance with a change in environmental temperature is large, and the positions in which the laser beams are incident on these lenses 3 and 4 change, causing a problem that the scanning line interval on the scanning surface tends to vary. As described above, when the distance p is made greater than 20 µm, various problems as described above occur.

Figure 2:
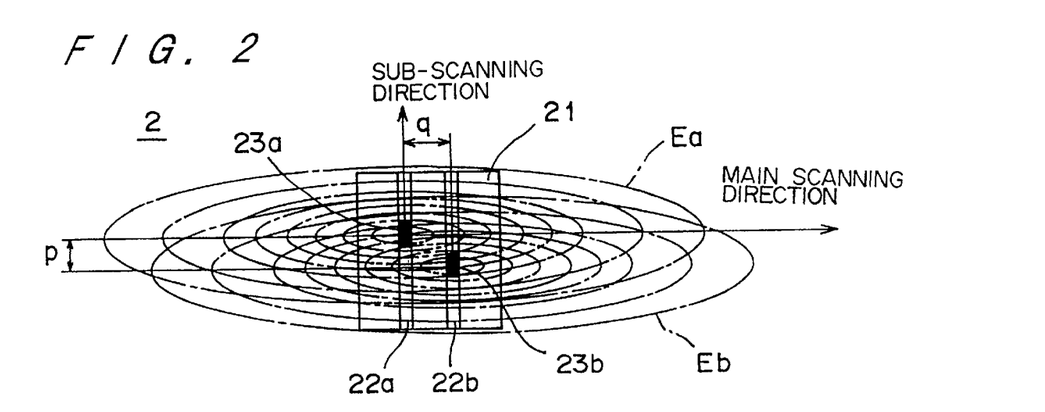
FIG. 2 is a diagram of intensity distributions of laser beams emitted from the semiconductor laser device shown in FIG. 1.

The multi-semiconductor laser device 2 having the above construction is generally an end surface light emitting type having a characteristic that the quantity of each laser beam to be emitted is great. Then, as shown in FIG. 2, each of the laser beams emitted from the semiconductor laser device 2 has an elliptic intensity distribution in which its divergence angle is wide (about 30° by full width half maximum) in the direction perpendicular to the active layers 22a and 22b and is narrow (about 10° by full width half maximum) in the direction parallel to the active layers 22a and 22b. It is to be herein noted that Ea and Eb in FIG. 2 indicate equi-level lines of the intensity distributions of the laser beams. Accordingly, the semiconductor laser device 2 is mounted on the laser beam scanning optical apparatus of the multi-beam system in such a manner that its direction perpendicular to the active layers 22a and 22b is directed in the main scanning direction and its direction parallel to the active layers 22a and 22b is directed in the sub-scanning direction. As described in detail later, this arrangement is adopted for the reason that the focal distances of the collimator lens, cylindrical lens and scanning lens can be reduced for the compacting of the device when the direction of the wider divergence angle is arranged in the main scanning direction in terms of the construction of the laser beam scanning optical apparatus.

Description of Laser Beam Scanning Optical Apparatus

Figure 3:
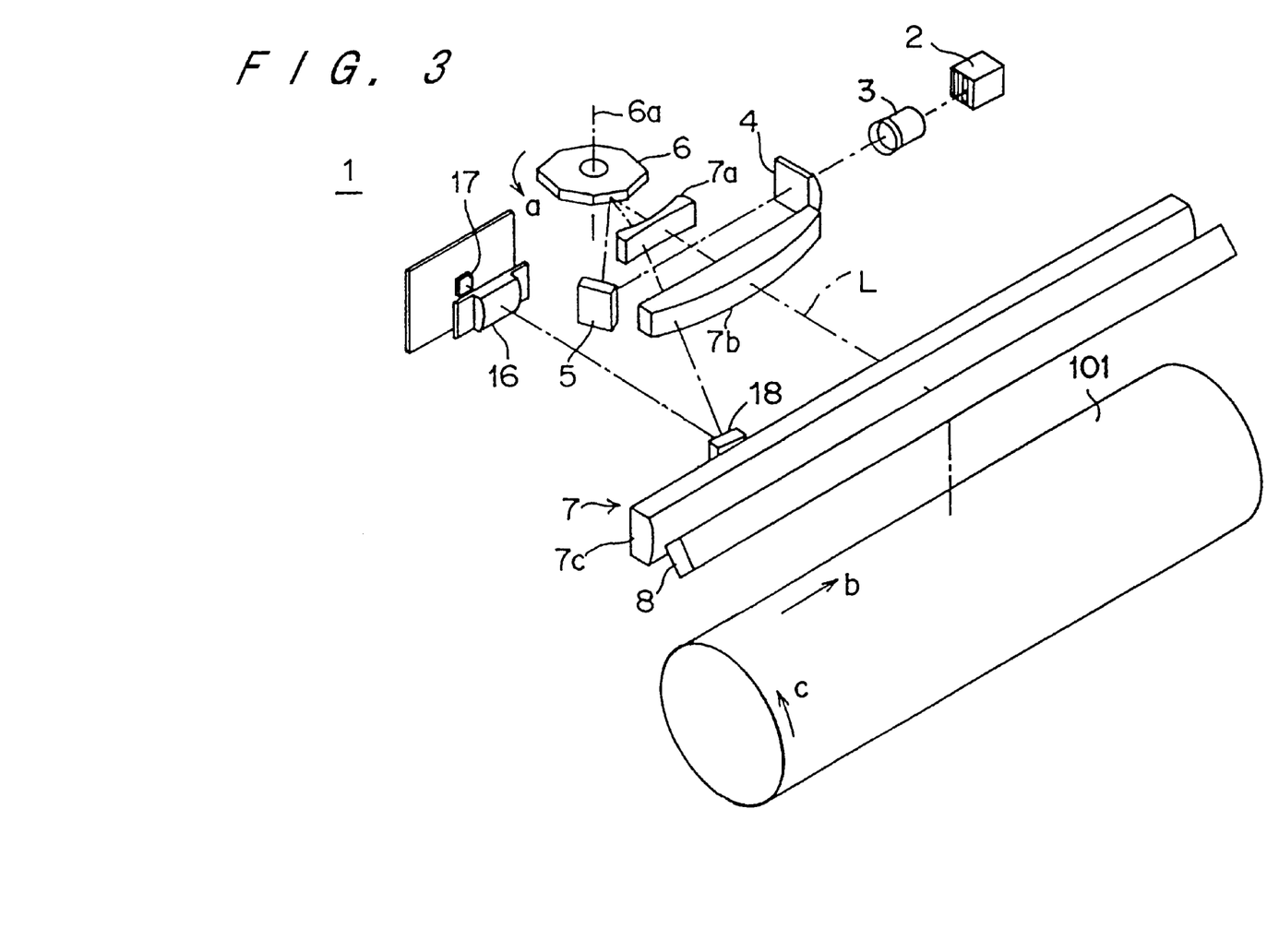
FIG. 3 is a perspective view showing a laser beam scanning optical apparatus employing the semiconductor laser device shown in FIG. 1 according to an embodiment.

FIG. 3 shows the total construction of the laser beam scanning optical apparatus 1 of the multi-beam system employing the laminate type multi-semiconductor laser device 2 shown in FIG. 1.

In FIG. 3, the laser beam scanning optical apparatus 1 is approximately constructed of the multi-semiconductor laser device 2, a collimator lens 3, a cylindrical lens 4, a plane mirror 5, a polygon mirror 6, an fθ-lens 7 (comprised of lenses 7a, 7b and 7c), a plane mirror 8, an SOS cylindrical lens 16 and an SOS optical sensor 17.

The multi-semiconductor laser device 2 is arranged in such a manner that the active layers 22a and 22b are perpendicular to the main scanning direction, i.e., parallel to the sub-scanning direction. Therefore, the direction of the wider divergence angle of laser beams L emitted from the semiconductor laser device 2 is arranged in parallel with the main scanning direction.

Figure 4:
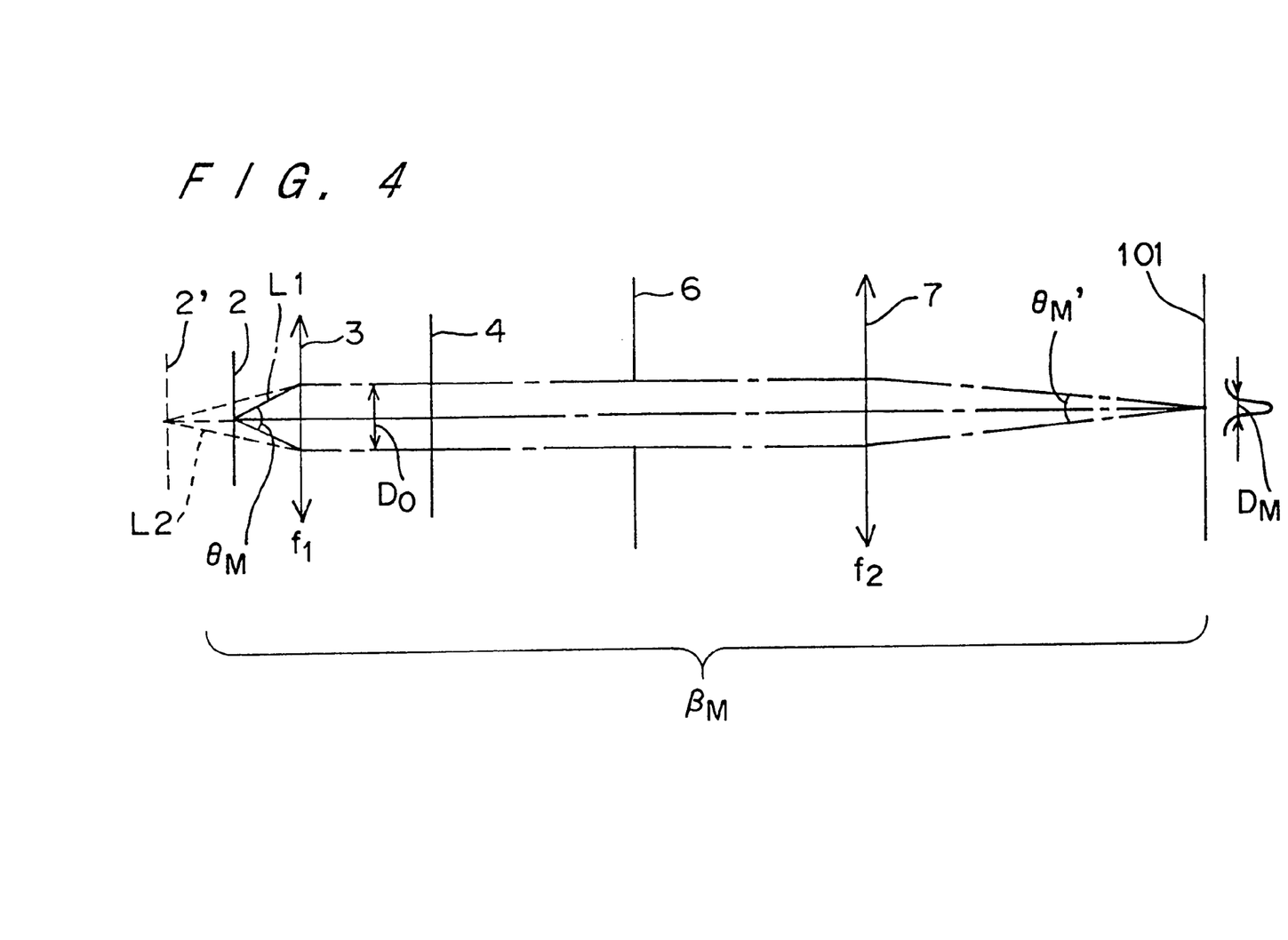
FIG. 4 is a graph of an optical path in the main scanning direction of the laser beam scanning optical apparatus shown in FIG. 3.
Figure 5:
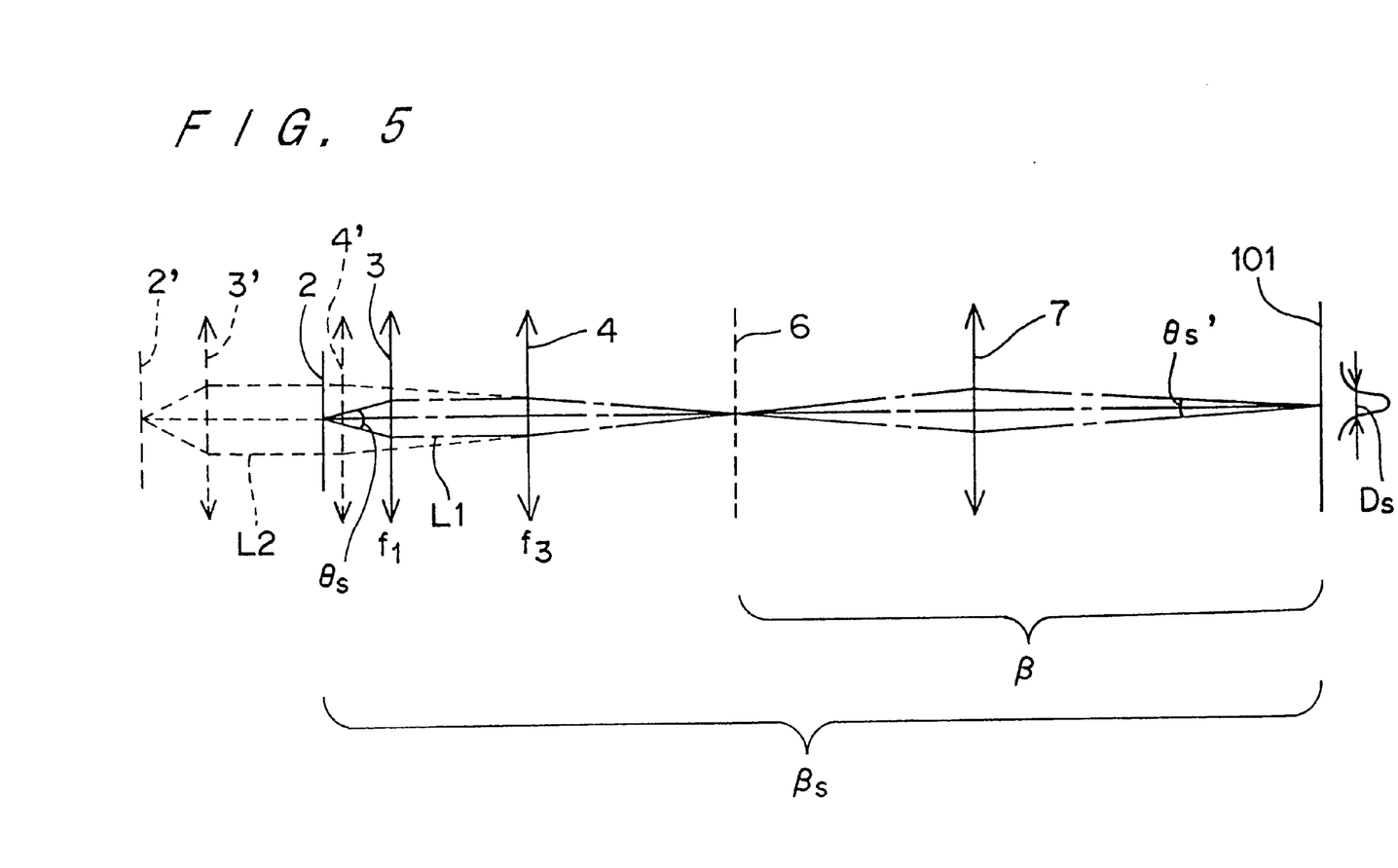
FIG. 5 is a graph of an optical path in the sub-scanning direction of the laser beam scanning optical apparatus shown in FIG. 3.

The reason why the device can be downsized when the direction of the wider divergence angle is arranged in parallel with the main scanning direction will be now described with reference to FIGS. 4 and 5. FIG. 4 shows an optical path in the main scanning direction, while FIG. 5 shows an optical path in the sub-scanning direction, in each of which only one light emitting region is shown.

In FIG. 4, assuming that the collimator lens 3 has a focal distance $f_1$, the fθ-lens 7 has a focal distance $f_2$, and the laser beams emergent from the collimator lens 3 are parallel bundles of rays, then the total main scanning magnification $\beta_M$ of the laser beam scanning optical apparatus 1 is expressed by the following equation (3).

$$\beta_M = -f_2/f_1 \quad (3)$$

Then, assuming that the wavelength of the laser beams emitted from the multi-semiconductor laser device 2 is constant, then an angle of incidence $\theta_M'$ of the laser beams in the main scanning direction to the scanning surface (photosensitive drum 101), the main scanning magnification $\beta_M$, an effective diameter $D_O$ of the laser beams which have passed through the collimator lens 3 and a divergence angle $\theta_M$ parallel to the main scanning direction of the laser beams emitted from the multi-semiconductor laser device 2 are uniquely determined successively depending on a laser beam spot diameter $D_M$ and the brightness on the scanning surface. Therefore, the focal distance $f_1$ of the collimator lens 3 can be further reduced in the case of the multi-semiconductor laser device 2 in which the direction of the wider divergence angle is arranged in the main scanning direction (see the optical path indicated by the one-dot chain lines L1 in FIG. 4) than in the case of a multi-semiconductor laser device 2' in which the direction of the wider divergence angle is arranged in the sub-scanning direction (see the optical path indicated by the dashed lines L2 in FIG. 4). Therefore, the interval between the multi-semiconductor laser device 2 in which the direction of the wider divergence angle is arranged in the main scanning direction and the collimator lens 3 becomes shorter than the interval between the multi-semiconductor laser device 2' in which the direction of the wider divergence angle is arranged in the sub-scanning direction and the collimator lens 3, consequently allowing the device to be downsized and allowing the brightness of the laser beam spots on the scanning surface to be increased.

Furthermore, in FIG. 5, assuming that the cylindrical lens 4 has a focal distance $f_3$ and the fθ-lens 7 has a sub-scanning magnification $\beta$, then the total sub-scanning magnification $\beta_S$ of the laser beam scanning optical apparatus 1 is expressed by the following equation (4).

$$\beta_S = -(f_3/f_1) \cdot \beta \quad (4)$$

Then, in order to achieve higher image quality in the main scanning direction, the laser beam spot shape on the scanning surface should be made small in the main scanning direction and made large in the sub-scanning direction, and therefore, the angle of incidence $\theta_S$ of the laser beams in the sub-scanning direction to the scanning surface should be smaller than an angle of incidence $\theta_S'$ in the main scanning direction to the scanning surface. Further, in order to improve the function of an optical system for correcting an error of perpendicularity of reflective facets of the polygon mirror 6, the sub-scanning magnification $\beta$ of the scanning lens 7 is required to be reduced. On the other hand, the angle of incidence $\theta_S'$ of the laser beams in the sub-scanning direction to the scanning surface, the sub-scanning magnification $\beta$ of the scanning lens 7 and the divergence angle $\theta_S$ parallel to the sub-scanning direction of the laser beams emitted from the multi-semiconductor laser device 2 are uniquely determined successively depending on a laser beam spot diameter $D_S$ and the brightness on the scanning surface.

Therefore, the focal distance $f_3$ of the cylindrical lens 4 can be further reduced in the case of the multi-semiconductor laser device 2 in which the direction of the wider divergence angle is arranged in the main scanning direction (see the optical path indicated by the one-dot chain lines L1 in FIG. 5) than in the case of the multi-semiconductor laser device 2' in which the direction of the wider divergence angle is arranged in the sub-scanning direction (see the optical path indicated by the dashed lines L2 in FIG. 5). Therefore, the interval between the cylindrical lens 4 and the polygon mirror 6 in the case where the direction of the wider divergence angle is arranged in the main scanning direction is shorter than the interval between a cylindrical lens 4' and the polygon mirror 6 in the case where the direction of the wider divergence angle is arranged in the sub-scanning direction, consequently allowing the device to be downsized.

Furthermore, in the present embodiment, the laser beams, which are a bundle of rays parallel to the optical axis in the main scanning direction, are incident to the polygon mirror 6, and therefore, the image-forming position is not displaced on the scanning surface (photosensitive drum 101), and the image heights in the main scanning direction of the laser beams emitted from the light emitting regions 23a and 23b can be made to coincide with each other. It is to be noted that the laser beams incident to the polygon mirror 6 is not necessarily parallel bundles of rays, and it is acceptable to make convergent or divergent bundles of rays incident to the polygon mirror 6. In such a case, it is required to subject the individual light emitting regions 23a and 23b to electrical correction by address correction of the laminate type multi-semiconductor laser device 2 on a clock bit map.

Referring back to FIG. 3, the description of the laser beam scanning optical apparatus 1 will be continued.

The semiconductor laser device 2 is subjected to a modulation control (turned on and off) based on printing data inputted to a drive circuit (not shown) to emit the laser beams L when turned on. These laser beams L are converged approximately in parallel by the collimator lens 3 and reach the polygon mirror 6 by way of the cylindrical lens 4 and the plane mirror 5.

The polygon mirror 6 is rotatively driven at a constant velocity in the direction of arrow "a" around a shaft 6a. The laser beams L are deflected at a constant angular velocity by each reflective facet based on the rotation of the polygon mirror 6 and made incident to the fθ-lens 7. The laser beams L that have passed through the fθ-lens 7 are reflected on the plane mirror 8 and thereafter converged on the photosensitive drum 101 so as to scan the photosensitive drum 101 in the direction of arrow "b". The fθ-lens 7 mainly functions to correct the main scanning velocity of the laser beams L deflected at a constant angular velocity on the polygon mirror 6 to a constant velocity on the scanning surface (photosensitive drum 101), i.e., to correct distortion.

The photosensitive drum 101 is rotatively driven at a constant velocity in the direction of arrow "c", and an image (electrostatic latent image) is formed on the drum 101 by the main scanning in the direction of arrow "b" by the polygon mirror 6 and the sub-scanning in the direction of arrow "c" of the drum 101.

Further, the laser beams L are reflected on a mirror 18 at the leading end in the main scanning direction, made to transmit the SOS cylindrical lens 16 and then made incident to the SOS optical sensor 17. A beam detection signal outputted from the SOS optical sensor 17 generates a vertical synchronization signal for determining a print start position of every scanning line.

The laser beam scanning optical apparatus 1 of the multi-beam system having the above construction is set in such a manner that the direction of the wider divergence angle of the laser beams emitted from the semiconductor laser device 2 is arranged in parallel with the main scanning direction. With this arrangement, there can be adopted an optical system having a structure similar to the optical system of a laser beam scanning optical apparatus of the single-beam system employing a semiconductor laser device in which only one light emitting region is provided in the active layer. As a result, the laser beam scanning optical apparatus 1 of the multi-beam system can be also used as a laser beam scanning optical apparatus of the single-beam system merely by replacing the laser source (including the driver for driving the semiconductor laser device), allowing the manufacturing cost to be reduced. It is to be noted that the number of reflective facets and the rotating velocity of the polygon mirror 6 are required to be changed for the change of the deflecting velocity as occasion demands.

Other Embodiments

Figure 6:
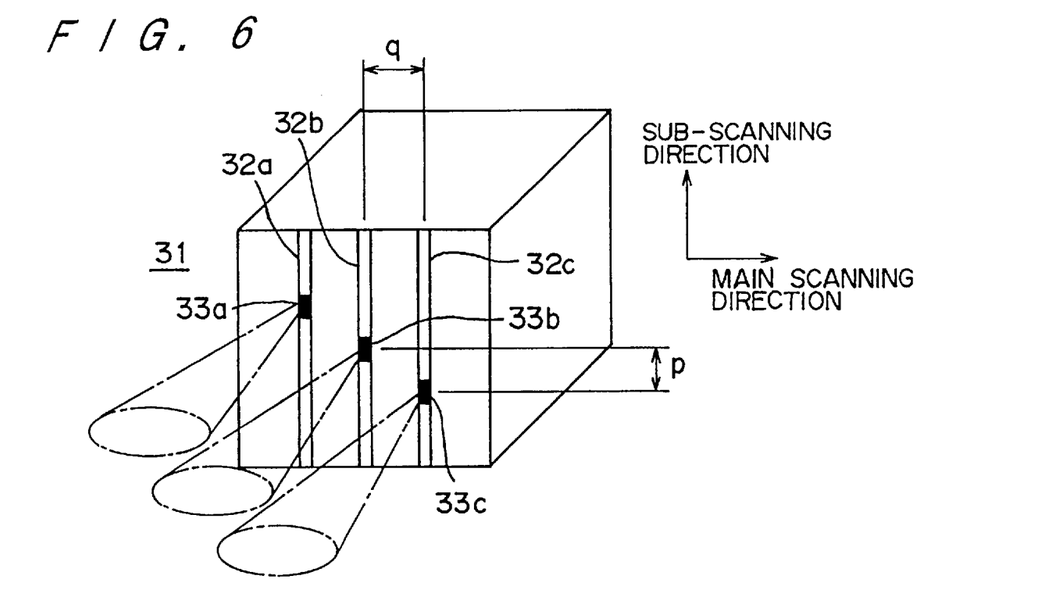
FIG. 6 is a perspective view showing a laminate type multi-semiconductor laser device according to another embodiment.

It is to be noted that any of laminate type multi-semiconductor laser devices having a variety of arrangements is selected according to specifications. For example, as shown in FIG. 6, there may be a multi-semiconductor laser device 31 having three active layers 32a, 32b and 32c. Also in this case, it is preferable to locate light emitting regions 33a, 33b and 33c in such a manner that the interval p in the sub-scanning direction becomes smaller than the interval q in the main scanning direction.

Figure 7:
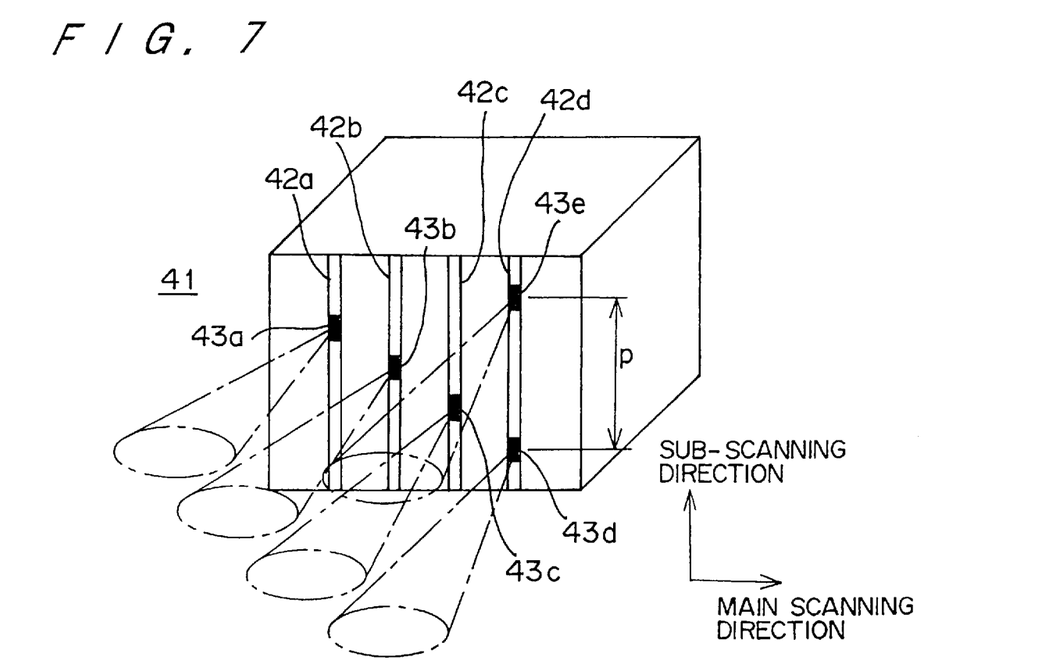
FIG. 7 is a perspective view showing a laminate type multi-semiconductor laser device according to another embodiment.

Furthermore, as shown in FIG. 7, when a multi-semiconductor laser device 41 has five light emitting regions 43a, 43b, 43c, 43d and 43e, it is acceptable to provide four active layers 42a, 42b, 42c and 42d, set the light emitting regions 43a through 43c at the respective active layers 42a through 42c in a one-to-one correspondence manner and set the two light emitting regions 43d and 43e at the active layer 42d. By thus setting a plurality of light emitting regions at an identical active layer, the distance between the light emitting regions 43a and 43e located at both ends in the main scanning direction can be reduced further than in the case where only one light emitting region is simply set at one active layer, allowing the effective diameters and the angles of field of the collimator lens 3 and the cylindrical lens 4 to be reduced. Therefore, the aberration of the collimator lens 3 and so forth can be reduced, and the field angle when the laser beams are emergent from the collimator lens 3 or the like can be also reduced. Therefore, the positional displacement of the laser beams in the main scanning direction on the photosensitive drum after the laser beams have passed through the fθ-lens 7 can be also reduced.

The laminate type multi-semiconductor laser device and the laser beam scanning optical apparatus employing this semiconductor laser device of the present invention are not limited to the aforementioned embodiments, and they can be altered in various ways within the scope of the invention.

What is claimed is:

1. A multi-semiconductor laser device comprising:

a laminate wafer in which a plurality of active layers are laminated;

said active layers including a plurality of light emitting regions, a position of a light emitting region in one of said plurality of active layers being offset relative to a position of a light emitting region in an adjacent one of said plurality of active layers, a direction of said offset being perpendicular to a laminate direction of the laminate wafer;

wherein the following condition is satisfied:

$$q>p$$

where p is an interval between the light emitting regions of adjacent active layers in the direction perpendicular to the laminate direction of the laminate wafer; and q is an interval between the adjacent active layers.

2. A multi-semiconductor laser device in accordance with in claim 1, wherein the interval p further satisfies a relational expression of $p<100\ \mu m$.

3. A multi-semiconductor laser device in accordance with claim 1, wherein the interval p further satisfies a relational expression of $p<20\ \mu m$.

4. A multi-semiconductor laser device in accordance with claim 1, wherein the interval p further satisfies a relational expression of $p<15\ \mu m$.

5. A multi-semiconductor laser device in accordance with claim 1, wherein the interval p and the interval q further satisfy a relational expression of $(p^2+q^2)^{1/2}<100\ \mu m$.

* * * * *

UNITED STATES PATENT AND TRADEMARK OFFICE
CERTIFICATE OF CORRECTION

PATENT NO.    : 6,134,255
DATED         : October 17, 2000
INVENTOR(S)   : Toshio Naiki It is certified that error appears in the above-identified patent and that said Letters Patent is hereby corrected as shown below:

Drawings,
Delete Fig. 8, and insert:

FIG. 8 (Prior Art)

UNITED STATES PATENT AND TRADEMARK OFFICE
CERTIFICATE OF CORRECTION

PATENT NO. : 6,134,255
DATED : October 17, 2000
INVENTOR(S) : Toshio Naiki

It is certified that error appears in the above-identified patent and that said Letters Patent is hereby corrected as shown below:

Delete Fig. 9, and insert:

Title page,
Item [75], Inventor:, after "Naiki,", delete "Toyokawa", and insert -- Toyokawa-Shi --.

Column 10, claim 2,
Line 33, delete "p<100 μm", and insert -- $p \leq 100$ μm --.

Column 10, claim 3,
Line 37, delete "p<20 μm", and insert -- $p \leq 20$ μm --.

UNITED STATES PATENT AND TRADEMARK OFFICE
CERTIFICATE OF CORRECTION

PATENT NO. : 6,134,255
DATED : October 17, 2000
INVENTOR(S) : Toshio Naiki

It is certified that error appears in the above-identified patent and that said Letters Patent is hereby corrected as shown below:

<u>Title page,</u>
Item [75], Inventor: after "Naiki,", delete "Toyokawa", and insert -- Toyokawa-Shi --.

<u>Column 10, claim 4,</u>
Line 40, delete "$p<15$ μm", and insert -- $p \leq 15$ μm --.

<u>Column 10, claim 5,</u>
Line 44, delete "$(p^2+q)^{1/2} < 100$ μm", and insert -- $(p^2+q)^{1/2} \leq 100$ μm --.

Signed and Sealed this

Twelfth Day of February, 2002

Attest:

*Attesting Officer*

JAMES E. ROGAN
*Director of the United States Patent and Trademark Office*